(12) United States Patent
Kim

(10) Patent No.: US 8,829,525 B2
(45) Date of Patent: Sep. 9, 2014

(54) ORGANIC LIGHT EMITTING DISPLAY DEVICE

(75) Inventor: Tae-Gon Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 319 days.

(21) Appl. No.: 12/638,052

(22) Filed: Dec. 15, 2009

(65) Prior Publication Data

US 2010/0207107 A1 Aug. 19, 2010

(30) Foreign Application Priority Data

Feb. 16, 2009 (KR) .................. 10-2009-0012312

(51) Int. Cl.
*H01L 27/14* (2006.01)

(52) U.S. Cl.
USPC .................................. 257/72; 257/E27.133

(58) Field of Classification Search
USPC ........................... 257/72, E27.133
See application file for complete search history.

(56) References Cited

U.S. PATENT DOCUMENTS

| 2007/0015430 A1* | 1/2007 | Nishio et al. ............... 445/24 |
| 2007/0077349 A1* | 4/2007 | Newman et al. ............ 427/66 |
| 2008/0024057 A1* | 1/2008 | Kim ........................ 313/504 |
| 2008/0150419 A1 | 6/2008 | Kang |

FOREIGN PATENT DOCUMENTS

| JP | 2001-195008 | | 7/2001 |
| JP | 2001195008 A | * | 7/2001 |
| KR | 10-2003-0074227 | | 9/2003 |
| KR | 2003074227 A | * | 9/2003 |
| KR | 10-2006-0001502 A | | 1/2006 |
| KR | 10-2006-0065123 A | | 6/2006 |

OTHER PUBLICATIONS

KIPO Office action dated Aug. 30, 2010, for priority Korean Patent application 10-2009-0012312.

* cited by examiner

*Primary Examiner* — Amar Movva
(74) *Attorney, Agent, or Firm* — Christie, Parker & Hale, LLP

(57) ABSTRACT

An organic light emitting display device includes: a first substrate; a plurality of organic light emitting diodes on the first substrate; a plurality of spacers spaced apart from each other on sides of light emitting regions corresponding to the plurality of organic light emitting diodes; and a second substrate facing the first substrate and spaced apart from the first substrate at an interval by the plurality of spacers.

20 Claims, 4 Drawing Sheets

ORGANIC LIGHT EMITTING DISPLAY DEVICE

CROSS-REFERENCE TO RELATED APPLICATIONS

This application claims priority to and the benefit of Korean Patent Application No. 10-2009-0012312, filed on Feb. 16, 2009, in the Korean Intellectual Property Office, the entire content of which is incorporated herein by reference.

BACKGROUND

1. Field of the Invention

The present invention relates to an organic light emitting display device, and more particularly, to an organic light emitting display device having spacers.

2. Description of Related Art

An organic light emitting display device emits light by itself and has excellent properties with respect to viewing angles, contrast, response times, and power consumption, among other properties, when compared to, for example, a liquid crystal display device (LCD).

An organic light emitting diode in a pixel of the organic light emitting display device includes an anode electrode, a cathode electrode and an organic light emitting layer, and emits light in accordance with an energy difference generated while a hole injected through the anode electrode and an electron injected through the cathode electrode are recombined in the organic light emitting layer.

The organic light emitting layer of the organic light emitting diode is commonly formed using an inkjet printing method or a vacuum deposition method. However, the inkjet printing method is a complicated process, because a surface of a substrate should be planarized so that an organic material can be printed, and organic layers are limited to particular materials. The vacuum deposition method uses a shadow mask in order to selectively expose a light emitting region. However, due to drooping of the mask, it is not easy to deposit the organic materials in an exact pattern (e.g., shape), and the method is not applicable to a large-sized substrate. Also, stains may be formed due to contact with the mask, thereby causing a defective external appearance.

SUMMARY OF THE INVENTION

Exemplary embodiments of the present invention provide an organic light emitting display device having spacers which evenly and stably maintain an interval between a substrate and a shadow mask to selectively deposit an organic material.

Exemplary embodiments of the present invention also provide an organic light display device having spacers which comes into minimal or reduced contact with a sealing substrate.

According to an aspect of an exemplary embodiment of the present invention, there is provided an organic light emitting display device, including: a first substrate; a plurality of organic light emitting diodes on the first substrate; a plurality of spacers spaced apart from each other on sides of light emitting regions corresponding to the plurality of organic light emitting diodes; and a second substrate facing the first substrate and spaced apart from the first substrate at an interval by the plurality of spacers.

According to an aspect of another exemplary embodiment of the present invention, there is provided an organic light emitting display device, including: a first substrate; a plurality of organic light emitting diodes on the first substrate; a plurality of spacers on sides of light emitting regions corresponding to the plurality of organic light emitting diodes, the plurality of spacers each including a stripe-shaped supporting portion on a corresponding side of one of the light emitting regions and a plurality of contact portions spaced apart from each other on the supporting portion; and a second substrate facing the first substrate and spaced apart from the first substrate at an interval by the plurality of spacers.

The organic light emitting display device according to exemplary embodiments of the present invention includes a plurality of spacers that are arranged in a dot configuration or arrangement along the outer sides of the light emitting regions, and have cross-sections with an upper portion smaller than a lower portion. The shadow masks that selectively deposit an organic material are evenly supported in the light emitting regions at an interval (e.g., a predetermined interval) by the spacers arranged in a dot configuration, such that the organic light emitting layer can be formed in an accurate pattern (e.g., shape). Also, the spacers form dot or point contacts with the sealing substrate and maintain an interval between the substrate and the sealing substrate, such that the contact areas with the sealing substrate are minimized or reduced, thereby and reducing or avoiding external appearance defects due to stains.

BRIEF DESCRIPTION OF THE DRAWINGS

The accompanying drawings, together with the specification, illustrate exemplary embodiments of the present invention, and, together with the description, serve to explain the principles of embodiments of the present invention.

DETAILED DESCRIPTION

Figure 1A:
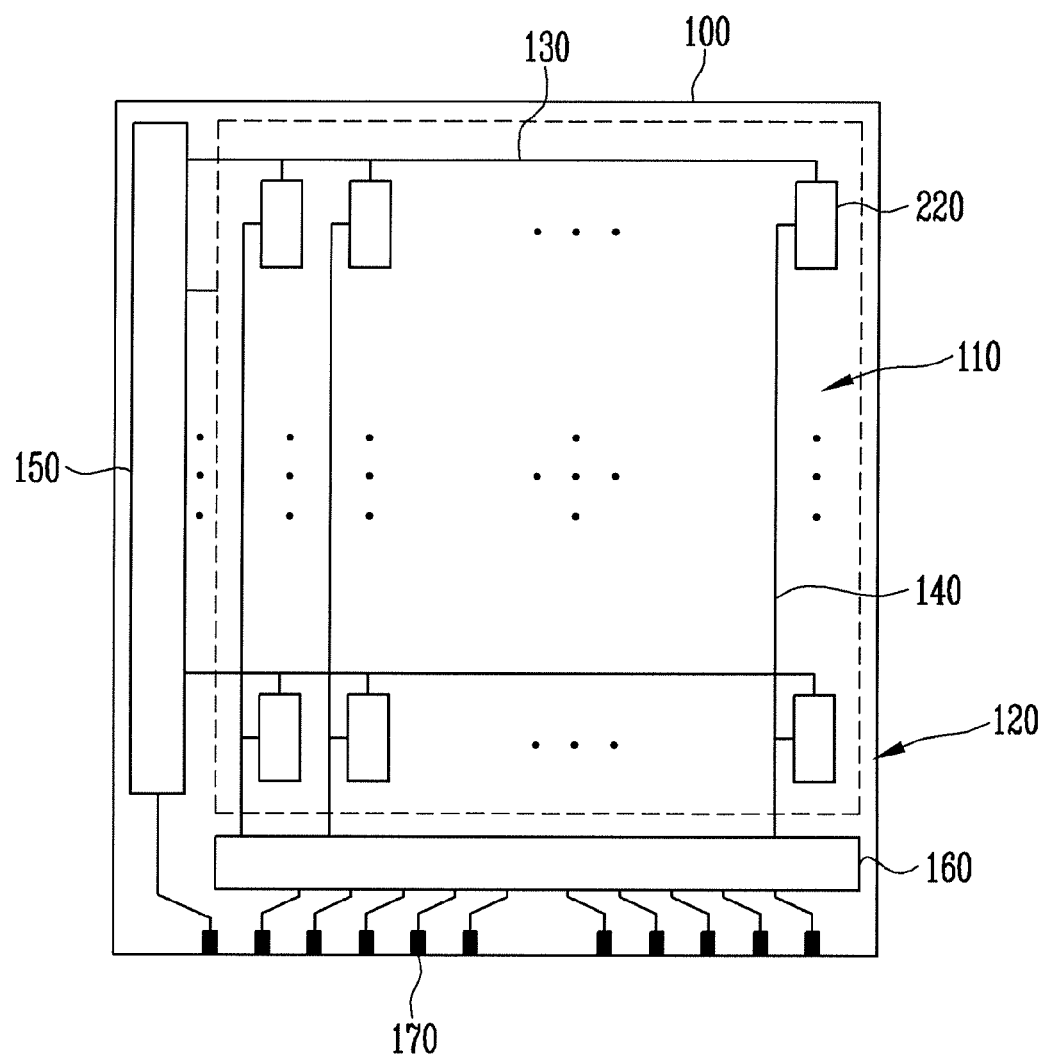
FIGS. 1A and 1B are a schematic plan view and a schematic cross-sectional view of an organic light emitting display device according to an embodiment of the present invention.

In the following detailed description, only certain exemplary embodiments of the present invention have been shown and described by way of illustration. As those skilled in the art will recognize, the described embodiments may be modified in various different ways without departing from the spirit or scope of the present invention. Accordingly, the drawings and description are to be regarded as illustrative in nature and not restrictive. In addition, when an element is referred to as being "on" another element, it may be directly on the another element, or may be indirectly on the another element, with one or more elements interposed therebetween. Also, when an element is referred to as being "connected to" another element, it may be directly connected to the another element, or may be indirectly connected to the another element, with one or more elements connected therebetween. Hereinafter, like reference numerals refer to like elements.

Hereinafter, exemplary embodiments according to the present invention will be described in detail with reference to the accompanying drawings.

Figure 1B:
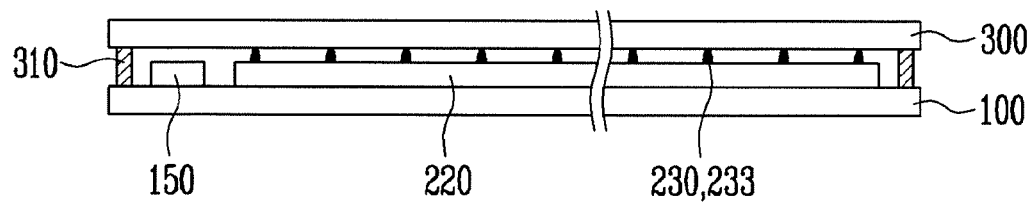

FIGS. 1A and 1B are a schematic plan view and a schematic cross-sectional view of an organic light emitting display device according to an embodiment of the present invention.

Referring to FIG. 1A, a substrate 100 includes a display region 110 and a non-display region 120. The non-display region 120 surrounds the display region 110, and may be considered regions of the substrate 100 other than the display region 110.

A plurality of organic light emitting diodes 220 coupled between scan lines 130 and data lines 140 in a matrix type are disposed on the substrate 100 in the display region 110. On the substrate 100 the scan lines 130 and the data lines 140 in the display region 110 extend into the non-display region 120, power supply lines for providing power to the organic light emitting diodes 220, and a scan driver 150 and a data driver 160 for processing signals provided from the outside, for example, through pads 170, and for supplying corresponding signals to the scan lines 130 and the data lines 140. The scan driver 150 and the data driver 160 include driving circuits for generating scan signals and data signals, corresponding to the signals supplied from the outside via the pads 170, to selectively drive the respective organic light emitting diodes 220.

Referring to FIG. 1B, in order to seal the display region 110, the sealing substrate 300 is disposed over the substrate 100 and facing the substrate 100, on which the organic light emitting diodes 220 are formed, and the sealing substrate 300 is bonded to the substrate 100 by sealant 310. At this time, the sealing substrate 300 maintains an interval (e.g., a predetermined interval) from the substrate 100 by utilizing the plurality of spacers 230 and/or 233.

The spacers 230 are arranged in a dot configuration or arrangement between the plurality of organic light emitting diodes 220, and are arranged in a row direction and in a column direction. More particularly, the spacers 230 are arranged along the sides of the respective light emitting regions 240 of the plurality of organic light emitting diodes 220, shown in FIG. 2. In other words, the spacers 230 are spaced apart from each other along the sides of the respective light emitting regions 240 in both the row direction and the column direction, as shown in FIG. 2.

Figure 2:
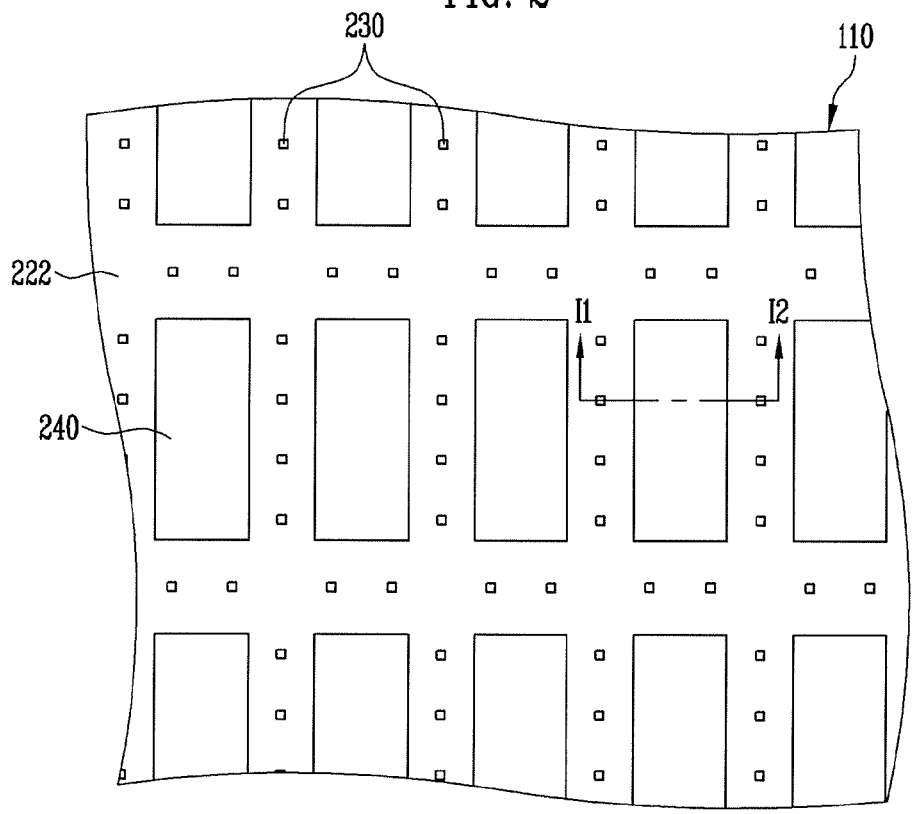
FIG. 2 is a schematic plan view of a pixel region including spacers of FIG. 1B.
Figure 3:
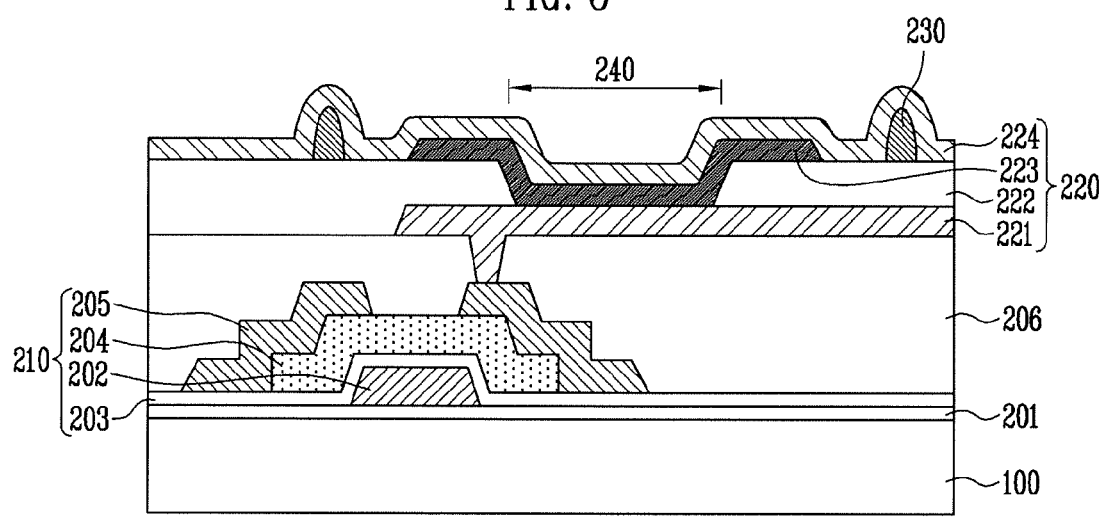
FIG. 3 is a schematic cross-sectional view taken along line I1-I2 of FIG. 2.

FIG. 3 is a schematic cross-sectional view taken along the line I1-I2 of FIG. 2. A thin film transistor for controlling an operation of an organic light emitting diode and a capacitor for maintaining a signal corresponding to the operation of the organic light emitting diode are coupled to the organic light emitting diode in each pixel. However, for convenience of explanation, FIG. 3 shows only a thin film transistor 210 and an organic light emitting diode 220.

Referring to FIG. 3, the organic light emitting diode 220 includes an anode electrode 221, a cathode electrode 224, and an organic light emitting layer 223 between the anode electrode 221 and the cathode electrode 224.

The anode electrode 221 is formed on the substrate 100. The organic light emitting layer 223 is formed in at least a light emitting region 240 (a region where the anode electrode 221 is exposed), defined by a pixel definition layer 222, and may include a hole injection layer, a hole transport layer, an electron transport layer and an electron injection layer. The cathode electrode 224 is formed on the organic light emitting layer 223 and the pixel definition layer 222.

The thin film transistor 210 includes a semiconductor layer 204 that provides source and drain regions and a channel region, a gate electrode 202 insulated from the semiconductor layer 204 by a gate insulating film 203, and source and drain electrodes 205 respectively coupled to the semiconductor layer 204 at the source and drain regions. Reference numerals 201 and 206 indicate a buffer layer and a planarization insulating layer, respectively.

Referring to FIGS. 2 and 3, the plurality of spacers 230 are formed on the pixel definition layer 222 along the sides of the light emitting regions 240 and between adjacent light emitting regions 240. The spacers 230 are arranged in a dot configuration or arrangement, so that an interval between a shadow mask (not shown) that selectively deposits an organic material and the substrate 100, or an interval between the sealing substrate 300 and the substrate 100, can be evenly and stably maintained, wherein the spacers generally have a hemisphere shape or a trapezoid shape having a cross-section with an upper portion smaller than a lower portion, for reducing or minimizing contact with the sealing substrate 300. A dot configuration or arrangement may indicate that the plurality of spacers 230 are spaced apart from each other along the sides of the light emitting regions 240 in both the row direction and the column direction, as shown in FIG. 2.

Figure 4:
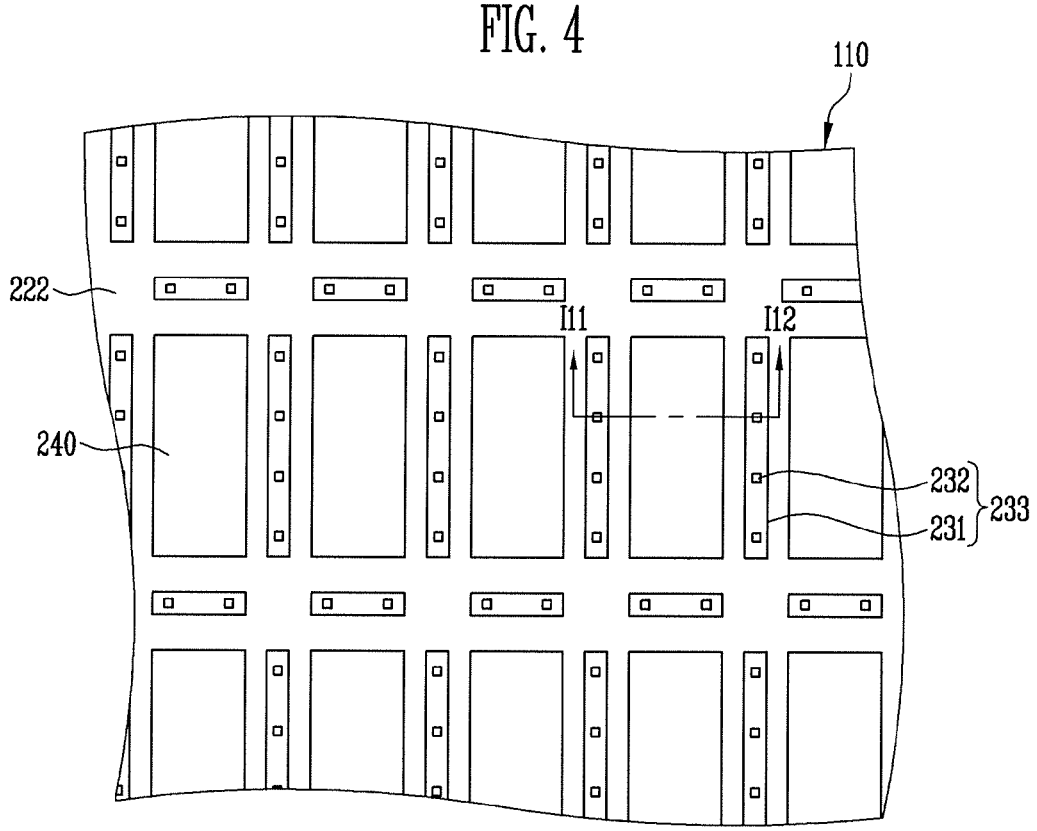
FIG. 4 is a schematic plan view of a pixel region illustrating another embodiment of spacers.
Figure 5:
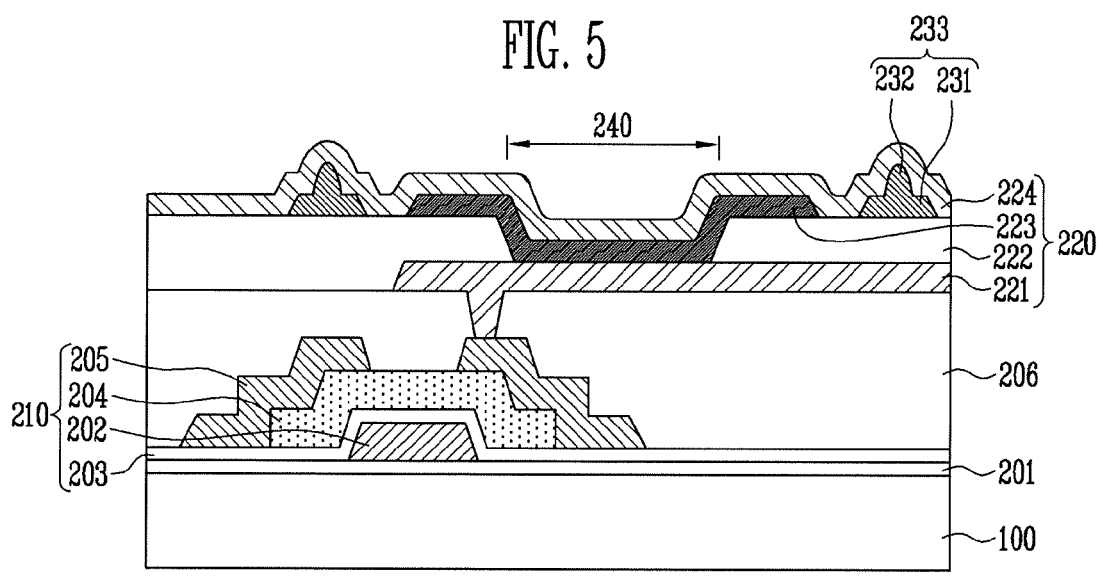
FIG. 5 is a cross-sectional view taken along line I11-I12 of FIG. 4.

The embodiment has been explained with reference to a structure where the hemisphere-shape or trapezoid-shape spacers 230 are arranged in a dot configuration or arrangement. However, in another embodiment, spacers 233 may include supporting portions 231 along the sides of the light emitting regions 240 in a stripe configuration or arrangement (e.g., the supporting portions 231 are stripe-shaped) and having a thickness (e.g., a predetermined thickness), and a plurality of contact portions 232 arranged on the supporting portions 231 in a dot configuration or arrangement, as shown in FIGS. 4 and 5. The contact portions 232 are arranged in a dot configuration so that an interval between a mask (not shown) that selectively deposits an organic material and the substrate 100, or an interval between the sealing substrate 300 and the substrate 100, can be evenly and stably maintained. Such contact portions 232 generally have a hemisphere shape or a trapezoid shape having a cross-section with an upper portion smaller than a lower portion, for reducing or minimizing contact with the sealing substrate 300. The supporting portions 231 generally have a thickness such that the contact portions 232 are stably supported thereupon, such that the intervals between the sealing substrate 300 and the substrate 100 can be properly secured.

A method of manufacturing an organic light emitting display device according to an embodiment of the present invention will be explained with reference to FIGS. 6A to 6D.

Figure 6A:
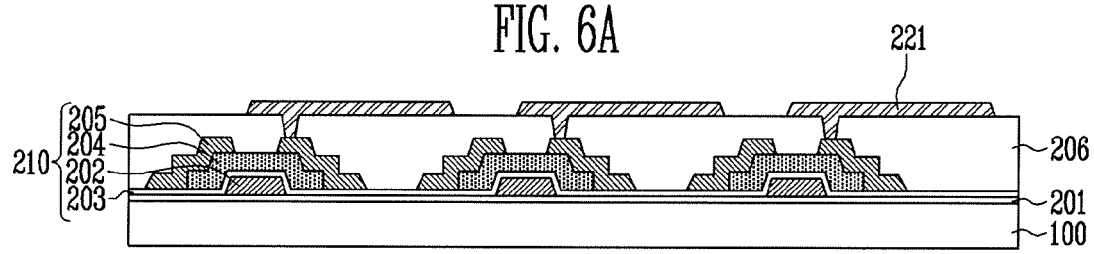
FIGS. 6A to 6D are cross-sectional views illustrating a method of manufacturing an organic light emitting display device according to an embodiment of the present invention.

Referring to FIG. 6A, after a thin film transistor 210 is formed as shown in FIG. 3, the planarization insulating layer 206 is formed on the substrate 100. Thereafter, via holes are formed on the planarization insulating layer 206 to expose the source or drain electrodes 205 of the thin film transistors 210, and the anode electrodes 221 coupled to the source or drain electrodes 205 through the via holes are formed.

Figure 6B:
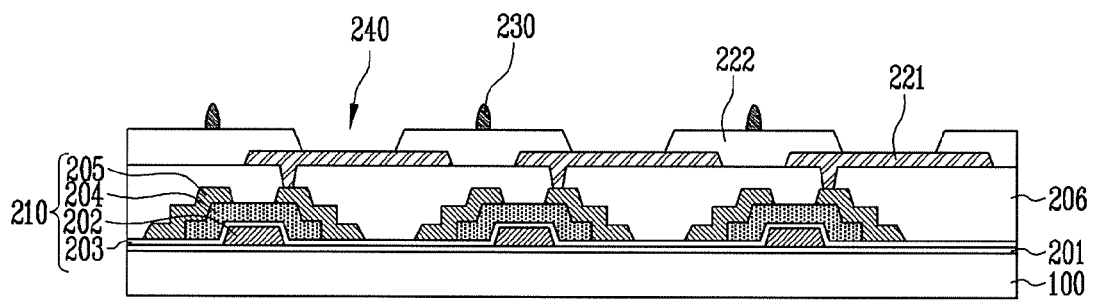

Referring to FIG. 6B, the pixel definition layer 222 is formed on the substrate on the anode electrodes 221, and then the pixel definition layer 222 is patterned or etched so that the anode electrodes 221 are exposed in light emitting regions 240. The spacers 230 are formed along the sides of the light emitting regions 240 on the pixel definition layer 222.

Spacers 230 may be formed, for example, by forming photoresist films or insulating films on upper surfaces of the substrate 100, and then patterning the films using a photolithography method or an etching method using masks, as described with respect to FIG. 2. At this time, if the interval which would be formed by the spacers 230 is determined to be below a range (e.g., a predetermined range), the lower ends of the spacers 230 may be coupled to each other, and spacers 233 may be formed in a shape including supporting parts 231 and contacting parts 232 as shown in FIG. 4.

Figure 6C:
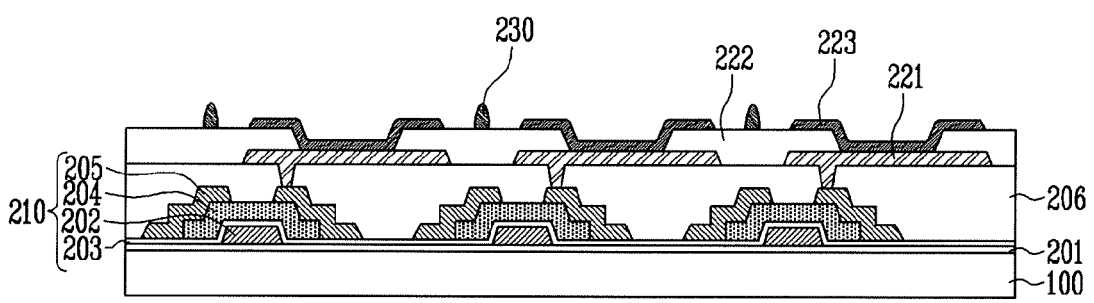

Referring to FIG. 6C, the organic light emitting layers 223 are formed on the exposed anode electrodes 221 in the light emitting regions 240. When using the vacuum deposition method, masks (not shown) are mounted on the upper portion of the substrate 100 so that the organic light emitting layers 223 are selectively deposited in the light emitting regions 240. At this time, the masks are evenly supported by the spacers 230 arranged in a dot configuration, and at the same time, intervals (e.g., predetermined intervals) are maintained therein, so that the organic light emitting layers 223 can be formed in an accurate pattern (e.g., shape).

Figure 6D:
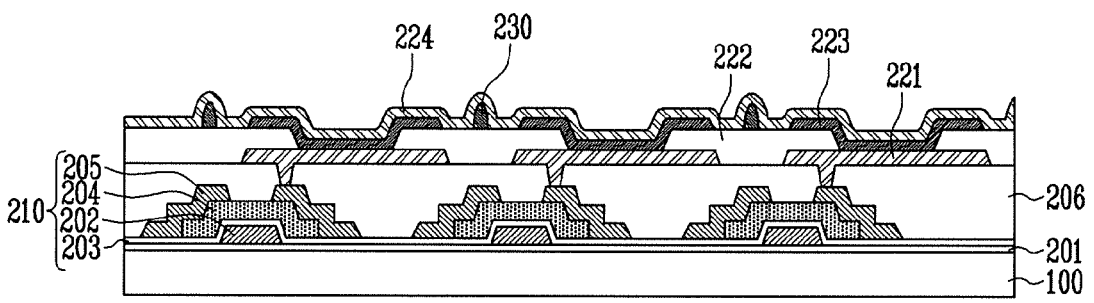

Referring to FIG. 6D, the cathode electrodes 224 are formed on the pixel definition layer 222, the organic light emitting layers 223, and the spacers 230.

If the manufacturing of the organic light emitting diode 220 is completed as shown in FIG. 6D, the sealing substrate 300 is disposed over the substrate 100 and bonded to the substrate 100 by the sealant 310, shown in FIG. 1B. At this time, the plurality of spacers 230 and/or 233 form dot contacts (or point contacts) with the sealing substrate 300 and allow the substrate 100 and the sealing substrate 300 to be maintained at an interval (e.g., a predetermined interval), such that contact with the sealing substrate 300 is minimized or reduced, thereby also minimizing or reducing external appearance defects due to stains.

In these embodiments, only the spacers 230 and/or 233 formed in the display region 110 are explained through the drawings, but the spacers may also be arranged in portions other than the display region 110 (e.g., in the non-display region 120), to more properly support masks or sealing substrates.

While the present invention has been described in connection with certain exemplary embodiments, it is to be understood that the invention is not limited to the disclosed embodiments, but is instead intended to cover various modifications and equivalent arrangements included within the spirit and scope of the appended claims, and equivalents thereof.

What is claimed is:

1. An organic light emitting display device, comprising:
   a first substrate;
   a plurality of organic light emitting diodes on the first substrate, each of the organic light emitting diodes comprising a light emitting region comprising one side;
   a plurality of spacers that are spaced apart from each other and alongside a region between two ends of the one side of the light emitting region of one of the organic light emitting diodes; and
   a second substrate facing the first substrate and spaced apart from the first substrate at an interval by the plurality of spacers,
   wherein adjacent ones of the spacers that are each alongside the region between the two ends of the one side of the light emitting region of the one of the organic light emitting diodes are discontinuous, unconnected, and spaced apart from each other.

2. The organic light emitting display device as claimed in claim 1, wherein each of the plurality of organic light emitting diodes comprises:
   a first electrode on the first substrate;
   a pixel definition layer on the first substrate and the first electrode, and exposing the first electrode in a corresponding one of the light emitting regions;
   an organic light emitting layer on the first electrode in the corresponding one of the light emitting regions; and
   a second electrode on the pixel definition layer and the organic light emitting layer,
   wherein the plurality of spacers are arranged on the pixel definition layer.

3. The organic light emitting display device as claimed in claim 2, wherein the plurality of spacers are between the pixel definition layer and the second electrode.

4. The organic light emitting display device as claimed in claim 2, wherein the plurality of spacers are arranged on the pixel definition layer prior to forming the organic light emitting layer, and wherein a mask for forming the organic light emitting layer is spaced apart from the first substrate by the plurality of spacers.

5. The organic light emitting display device as claimed in claim 2, further comprising a thin film transistor coupled to the first electrode.

6. The organic light emitting display device as claimed in claim 1, wherein a cross-section of each of the plurality of spacers comprises an upper portion smaller than a lower portion.

7. The organic light emitting display device as claimed in claim 6, wherein the cross-section of each of the plurality of spacers is hemisphere shaped or trapezoid shaped.

8. The organic light emitting display device as claimed in claim 1, wherein the organic light emitting display device is separated into a display region and a non-display region, wherein the plurality of organic light emitting diodes are arranged in the display region, and wherein the plurality of spacers are arranged in the display region on the sides of the light emitting regions and in the non-display region.

9. The organic light emitting display device as claimed in claim 1, wherein the plurality of light emitting diodes are arranged in rows and columns; and
   wherein each of the plurality of spacers is between adjacent ones of the light emitting diodes in a same row or a same column.

10. The organic light emitting display device as claimed in claim 9,
    wherein at least one of the spacers is at a point along a path between a middle portion of the one side of the light emitting region of a first organic light emitting diode and a middle portion of the one side of the light emitting region of a second organic light emitting diode, and
    wherein the second organic light emitting diode is a next diode from the first organic light emitting diode in the same row or the same column.

11. An organic light emitting display device, comprising:
    a first substrate;
    a plurality of organic light emitting diodes on the first substrate, each of the organic light emitting diodes comprising a light emitting region comprising one side;
    a plurality of spacers each arranged along the one side of a corresponding one of the light emitting regions, the plurality of spacers each comprising a stripe-shaped supporting portion along the one side of the corresponding one of the light emitting regions and a plurality of contact portions that are discontinuous, unconnected, and spaced apart from each other and alongside a region between two ends of the one side of the light emitting region of one of the organic light emitting diodes on the supporting portion; and
    a second substrate facing the first substrate and spaced apart from the first substrate at an interval by the plurality of spacers.

12. The organic light emitting, display device as claimed in claim 11, wherein each of the plurality of organic light emitting diodes comprises:

a first electrode on the first substrate;

a pixel definition layer on the first substrate and the first electrode, and exposing the first electrode in a corresponding one of the light emitting regions;

an organic light emitting layer on the first electrode in the corresponding one of the light emitting regions; and a second electrode on the pixel definition layer and the organic light emitting layer, wherein the plurality of spacers are arranged on the pixel definition layer.

13. The organic light emitting display device as claimed in claim 12, wherein the plurality of spacers are between the pixel definition layer and the second electrode.

14. The organic light emitting display device as claimed in claim 12, wherein the plurality of spacers are arranged on the pixel definition layer prior to forming the organic light emitting layer, and wherein a mask for forming the organic light emitting layer is spaced apart from the first substrate by the plurality of spacers.

15. The organic light emitting display device as claimed in claim 12, further comprising a thin film transistor coupled to the first electrode.

16. The organic light emitting display device as claimed in claim 11, wherein a cross-section of each of the contact portions comprises an upper portion smaller than a lower portion.

17. The organic light emitting display device as claimed in claim 16, wherein the cross-section of each of the contact portions is hemisphere shaped or trapezoid shaped.

18. The organic light emitting display device as claimed in claim 11, wherein the organic light emitting display device is separated into a display region and a non-display region, wherein the plurality of organic light emitting diodes are arranged in the display region, and wherein the plurality of spacers are arranged in the display region on the sides of the light emitting regions and in the non-display region.

19. The organic light emitting display device as claimed in claim 11, wherein the plurality of contact portions are in discontinuous contact with the second substrate.

20. The organic light emitting display device as claimed in claim 19, wherein the plurality of contact portions are in a dot configuration on the stripe-shaped supporting portion.

\* \* \* \* \*